United States Patent
Raha et al.

(10) Patent No.: US 7,277,519 B2
(45) Date of Patent: Oct. 2, 2007

(54) FREQUENCY AND PHASE CORRECTION IN A PHASE-LOCKED LOOP (PLL)

(75) Inventors: Prasun K. Raha, Richardson, TX (US); T. Lakshmi Viswanathan, Dallas, TX (US); Richard E. Jennings, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 678 days.

(21) Appl. No.: 10/725,763

(22) Filed: Dec. 2, 2003

(65) Prior Publication Data

US 2005/0117680 A1 Jun. 2, 2005

(51) Int. Cl.
*H03D 3/24* (2006.01)

(52) U.S. Cl. .................. 375/376; 375/354; 375/371; 375/373

(58) Field of Classification Search ............ 375/376, 375/354, 371, 373
See application file for complete search history.

(56) References Cited

U.S. PATENT DOCUMENTS

| | | | |
|---|---|---|---|
| 5,036,294 A | | 7/1991 | McCaslin |
| 5,180,993 A | | 1/1993 | Dent |
| 5,491,439 A | | 2/1996 | Kelkar et al. |
| 5,818,304 A | * | 10/1998 | Hogeboom .................. 331/11 |
| 6,256,362 B1 | * | 7/2001 | Goldman .................... 375/373 |
| 6,947,514 B1 | * | 9/2005 | Kato et al. .................. 375/376 |
| 2001/0015677 A1 | * | 8/2001 | Choi ........................... 331/11 |
| 2002/0145473 A1 | * | 10/2002 | Masenas et al. ............. 331/10 |
| 2002/0175768 A1 | | 11/2002 | Masenas et al. |
| 2003/0020642 A1 | * | 1/2003 | Ely et al. .................... 341/111 |
| 2003/0091127 A1 | * | 5/2003 | Jensen et al. ............... 375/324 |
| 2003/0098746 A1 | * | 5/2003 | Aikawa et al. .............. 331/56 |
| 2003/0168662 A1 | * | 9/2003 | Pandey ........................ 257/74 |

\* cited by examiner

*Primary Examiner*—David C. Payne
*Assistant Examiner*—Erin M. File
(74) *Attorney, Agent, or Firm*—Alan K. Stewart; W. James Brady; Frederick J. Telecky, Jr.

(57) ABSTRACT

In one embodiment, a system for frequency and phase correction in a phase-locked loop (PLL) includes a phase frequency detector, first and second charge pumps respectively generating a first current and a voltage, a voltage-to-current (V2I) converter, a current summer, and a current-controlled oscillator (CCO). The phase frequency detector detects a frequency difference and a phase difference between a clock signal and a comparison signal, communicates the frequency difference to a first charge pump generating a first current, and communicates the phase difference to a second charge pump generating a voltage. The comparison signal is derived from an output signal of the PLL. The first charge pump modifies the first current according to the frequency difference and communicates the first current to the current summer. The second charge pump modifies the voltage according to the phase difference and communicates the voltage to the V2I converter. The V2I converter generates a second current corresponding to the voltage and communicates the second current to the current summer. The current summer combines the first and second currents with each other to generate a control current for the CCO and communicates the control current to the CCO. The CCO generates one or more oscillating signals according to the first and second currents. A frequency of an oscillating signal from the CCO changes in response to the modification of the first current, and a phase of the oscillating signal changes in response to the modification of the second current.

18 Claims, 4 Drawing Sheets

FREQUENCY AND PHASE CORRECTION IN A PHASE-LOCKED LOOP (PLL)

TECHNICAL FIELD OF THE INVENTION

This invention relates generally to electronic circuits and more particularly to frequency and phase correction in a PLL.

BACKGROUND

Oscillators are often used in circuit design to generate signals having specific frequencies. Known oscillators include voltage-controlled oscillators with inductance-capacitance (LC) components. Using LC components, however, may result in a large circuit with high power consumption. Other known oscillators include current-controlled oscillators. These known oscillators, however, may be overly sensitive to external conditions.

SUMMARY OF THE INVENTION

According to the present invention, disadvantages and problems associated with PLLs may be reduced or eliminated.

In one embodiment, a system for frequency and phase correction in a phase-locked loop (PLL) includes a phase frequency detector, first and second charge pumps respectively generating a first current and a voltage, a voltage-to-current (V2I) converter, a current summer, and a current-controlled oscillator (CCO). The phase frequency detector detects a frequency difference and a phase difference between a clock signal and a comparison signal, communicates the frequency difference to a first charge pump generating a first current, and communicates the phase difference to a second charge pump generating a voltage. The comparison signal is derived from an output signal of the PLL. The first charge pump modifies the first current according to the frequency difference and communicates the first current to the current summer. The second charge pump modifies the voltage according to the phase difference and communicates the voltage to the V2I converter. The V2I converter generates a second current corresponding to the voltage and communicates the second current to the current summer. The current summer combines the first and second currents with each other to generate a control current for the CCO and communicates the control current to the CCO. The CCO generates one or more oscillating signals according to the first and second currents. A frequency of an oscillating signal from the CCO changes in response to the modification of the first current, and a phase of the oscillating signal changes in response to the modification of the second current.

Particular embodiments of the present invention may provide one or more technical advantages. As an example, particular embodiments may enable a PLL to facilitate voltage scaling. As a result, the PLL may function properly at relatively low power-supply voltages, such as 0.5 volts. Particular embodiments are scalable with respect to a power supply voltage, such as $V_{DD}$. In particular embodiments, components of the PLL are implemented such that the PLL may be scalable with complementary metal-oxide semiconductor (CMOS) technology. Particular embodiments provide a feed-forward architecture. In particular embodiments, control current facilitates implementation of a feed-forward architecture. In particular embodiments, bias generation facilitates implementation of a feed-forward architecture. Particular embodiments may, compared with LC tank oscillators, reduce area requirements associated with a PLL. Particular embodiments are readily configurable for clock dithering, which may reduce power output of the PLL and thereby reduce interference from the PLL that might affect circuit elements (such as antennas) near the PLL. In particular embodiments, oscillator gain is substantially independent of process and temperature. Particular embodiments are configurable for high performance and low power applications. Certain embodiments may provide all, some, or none of these technical advantages. Certain embodiments may provide one or more other technical advantages, one or more of which may be readily apparent to those skilled in the art from the figures, descriptions, and claims herein.

BRIEF DESCRIPTION OF THE DRAWINGS

To provide a more complete understanding of the present invention and the features and advantages thereof, reference is made to the following description, taken in conjunction with the accompanying drawings, in which.

DESCRIPTION OF EXAMPLE EMBODIMENTS

Figure 1:
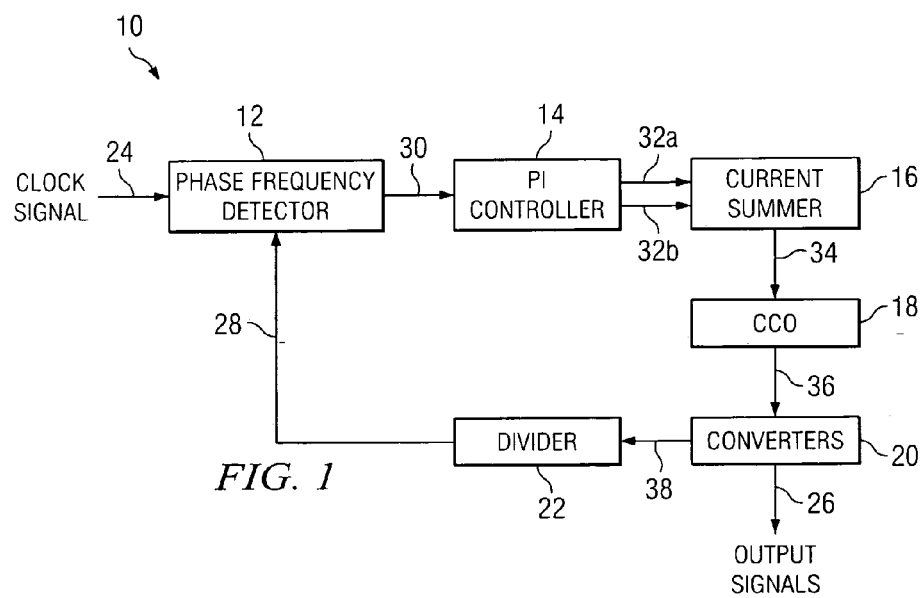
FIG. 1 illustrates an example PLL with frequency and phase correction.

FIG. 1 illustrates an example PLL 10 with frequency and phase correction. In one embodiment, PLL 10 includes a phase frequency detector 12, a proportional integral (PI) controller 14, a current summer 16, a CCO 18, one or more converters 20, and a divider 22. The components of PLL 10 may be coupled to each other using one or more wires, leads, or other suitable links. As an example, the components of PLL 10 may be coupled to a circuit board with embedded wires for coupling the components of PLL 10 to each other. Applications of PLL 10 include, for example, low-power, high-performance digital signal processor (DSP) cores, low-power wireless application-specific integrated circuits (ASICs), low-power serializer-deserializer (SERDES) interfaces, and other suitable applications.

PLL 10 may receive a clock signal 24 having a first frequency and, using clock signal 24, generate one or more PLL output signals 26 that each have a second frequency that is a multiple of the first frequency. As an example, PLL 10 may receive a clock signal 24 of approximately 60-70 MHz and, using clock signal 24, generate one or more output signals 26 of approximately 2.4 GHz. PLL 10 may receive clock signal 24 at phase frequency detector 12. Phase frequency detector 12 may compare clock signal 24 with a comparison signal 28 from divider 22 and determine, based on the comparison, a phase difference and a frequency difference between clock signal 24 and comparison signal 28, according to a suitable technique. Phase frequency detector 12 may generate a control signal 30 according to the phase and frequency differences and communicate control signal 30 to PI controller 14. As described below, PI controller 14 may generate two currents 32a and 32b based on control signal 30 and communicate currents 32 to current summer 16. Current 32a may correspond to a frequency difference between clock signal 24 and comparison signal 28, and current 32b may correspond to a phase difference between clock signal 24 and comparison signal 28.

Current summer 16 may combine currents 32a and 32b with each other and communicate a resulting control current 34 to CCO 18. In particular embodiments, CCO 18 may include one or more CCO elements (which may include delay cells) that each generate two sinusoidal oscillating signals 36 that have phases that are approximately 180° apart from each other. Each CCO element of CCO 18 may be coupled to a converter 20 that converts sinusoidal waves into square waves, according to a suitable technique. Converter 20 may receive oscillating signals 36 from CCO element 44 and, using oscillating signals 36, generate two square waves that have duty cycles of approximately fifty percent and phases that are approximately 180° apart from each other. Output signals 26 of PLL 10 may include these (and possibly other) square waves. PLL 10 may generate one or more output signals 26. In particular embodiments, all output signals 26 have frequencies that are approximately equal to each other. Phases of output signals 26 may be different from each other. In particular embodiments, phases of output signals 26 may be evenly spaced around 360°. As an example, if PLL 10 generates twelve output signals 26, output signals 26 may have phases at 0°, 30°, 60°, 90°, 120°, 150°, 180°, 210°, 240°, 270°, 300°, and 330 °.

A feedback signal 38 (which may include one or more output signals 26 of PLL 10) may be communicated from one or more converters 20 to divider 22. Divider 22 may receive feedback signal 38 and divide the frequency of feedback signal 38 according to a suitable technique to generate comparison signal 28 for phase frequency detector 12. As an example and not by way of limitation, if output signals 26 are intended to have frequencies that are each approximately one hundred times greater than the frequency of clock signal 24, divider 22 may divide the frequency of feedback signal 38 by one hundred to generate comparison signal 28. If a frequency difference exists between clock signal 24 and comparison signal 28, phase frequency detector 12 may communicate the frequency difference to PI controller 14 to cause PI controller 14 to modify current 32a (and therefore control current 34) to reduce the frequency difference, as described below. Similarly, if a phase difference exists between clock signal 24 and comparison signal 28, phase frequency detector 12 may communicate the phase difference to PI controller 14 to cause PI controller 14 to modify current 32b (and therefore control current 34) to reduce the phase difference, as described below.

Figure 2A:
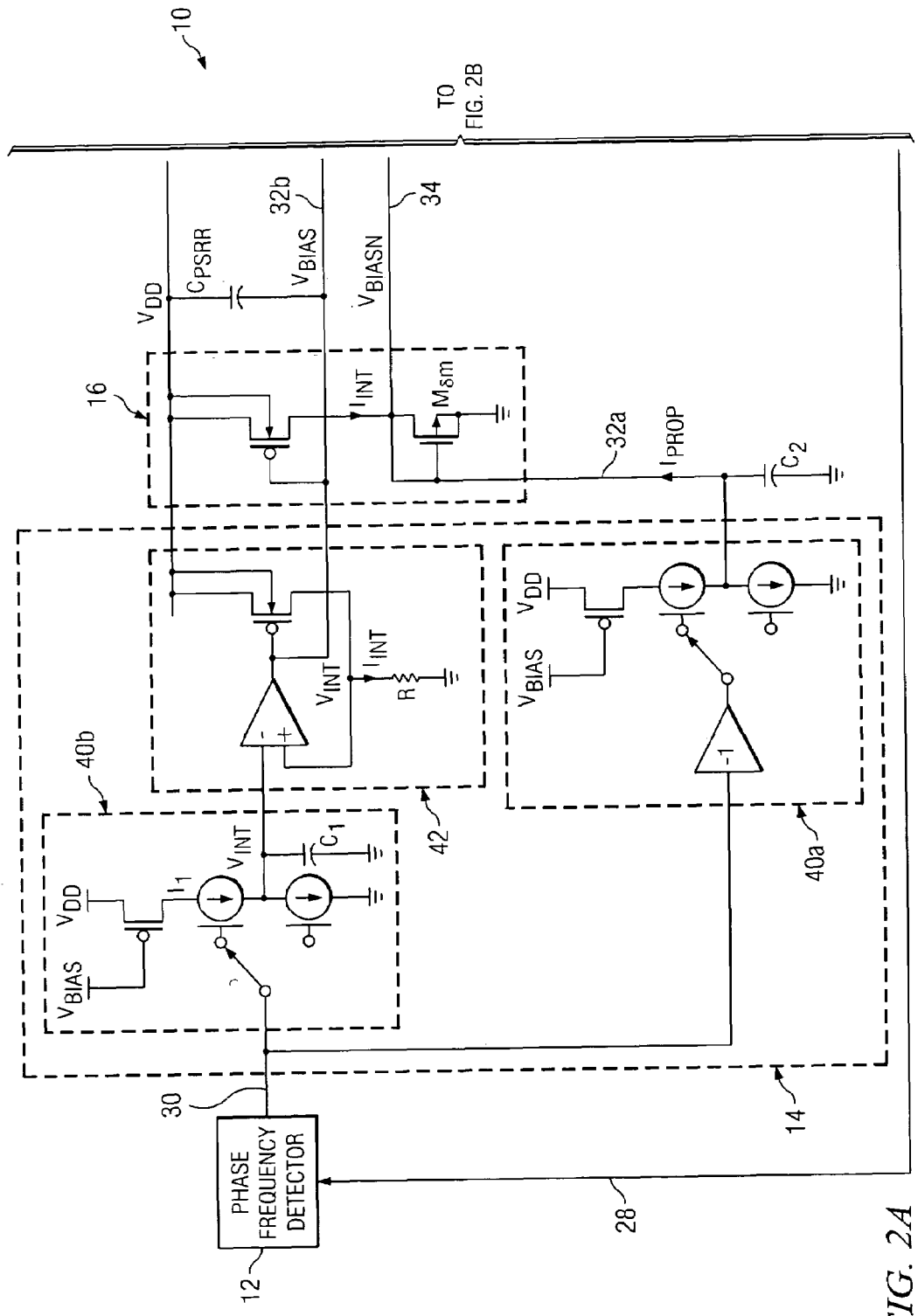
FIG. 2 illustrates, in greater detail, an example PLL with frequency and phase correction.
Figure 2B:
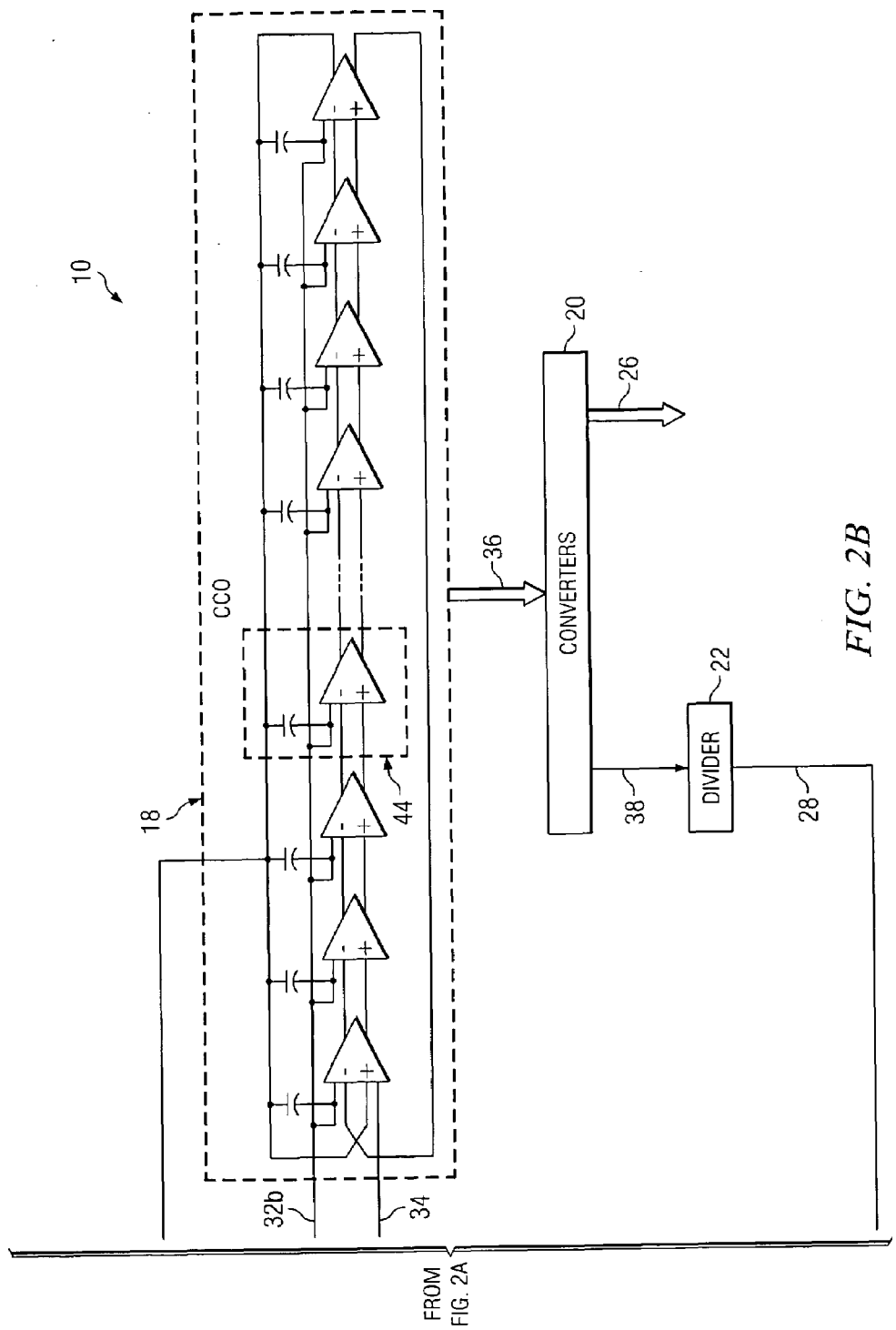

FIG. 2 illustrates, in greater detail, example PLL 10. In particular embodiments, the lower limit of $V_{DD}$ may be the threshold voltage of N-channel metal oxide semiconductor (NMOS) devices in PLL 10. In these NMOS devices, $V_{DD} > V_T + V_{DS}$ where $V_T$ is threshold voltage and $V_{DS}$ is saturation voltage. In particular embodiments, an upper limit of $V_{DD}$ may be determined according to an upper power-supply voltage limit (such as 1.2V) of transistors in PLL 10. PI controller 14 includes two charge pumps 40a and 40b and a voltage-to-current (V2I) converter 42. Charge pump 40a generates a current ($I_{PROP}$) that is proportional to a frequency difference between clock signal 24 and comparison signal 28. Current 32a may include $I_{PROP}$. Charge pump 40b generates a voltage ($V_{INT}$) that is proportional to a phase difference between clock signal 24 and comparison signal 28. V2I converter 42 converts $V_{INT}$ into a current ($I_{INT}$) that is proportional to this phase difference. Current 32b may include $I_{INT}$. $I_{PROP}$ and $I_{INT}$ are used to correct the frequency and phase differences, respectively. At current summer 16, $I_{PROP}$ is superimposed onto $I_{INT}$. The combined current ($I_{PROP} + I_{INT}$) is then used to drive CCO 18. If the frequency of an output signal 26 becomes greater or less than an intended multiple of the frequency of clock signal 24, $I_{PROP}$ may change to reduce this frequency difference. Similarly, if the phase of an output signal 26 shifts away from a phase of clock signal 24, $I_{INT}$ may change to reduce this phase difference.

V2I converter 42 may integrate current $I_1$ to generate current $I_{INT}$ according to the following two equations:

$$V_{INT} \approx \frac{1}{C_1} \int I_1 dt \qquad (1)$$

$$I_{INT} = \frac{V_{INT}}{R} \qquad (2)$$

Resistance R in V2I converter 42 may be trimmable, according to particular needs. R and Capacitances $C_1$ and $C_2$ collectively provide a transform, as shown in the following equation:

$$I_{BIAS} = f\left(\frac{\int I_1 \cdot dt}{RC_1}, I_{PROP}\right) \qquad (3)$$

$$= \frac{\int I_1 \cdot dt}{RC_1} \cdot \frac{g_m + 2s \cdot C_2}{g_m + s \cdot C_2} + I_{PROP} \cdot \frac{g_m}{g_m + s \cdot C_2}$$

In Equation 3, $g_m$ represents transconductance of metal oxide semiconductor field effect transistor (MOSFET) $Mg_m$ coupled to control current 34 and s represents a frequency of operation. If $C_2$ is greater than zero, PLL 10 is a third-order PLL 10. However, if $C_2$ becomes approximately zero, PLL 10 will become a second-order PLL 10. $C_1$, $C_2$, $C_{PSRR}$, and R may collectively dampen ringing that may occur in phase and frequency shifts in the output signal of the PLL. $C_2$ provides a third-order term to Equation (3), and, when $C_2$ is greater than zero, the output signal of the PLL may flatten out sooner after a phase shift, frequency shift, or both.

Loop gain G(s) of PLL 10 may be calculated as follows:

$$G(s) = \frac{I_{BIAS} K_{ICO}}{s \cdot M} \qquad (4)$$

$$= \frac{K_{ICO}}{M \cdot s} \left[ \frac{\int I_1 \cdot dt}{RC_1} \cdot \frac{g_m + 2s \cdot C_2}{g_m + s \cdot C_2} + I_{PROP} \cdot \frac{g_m}{g_m + s \cdot C_2} \right]$$

Figure 3:
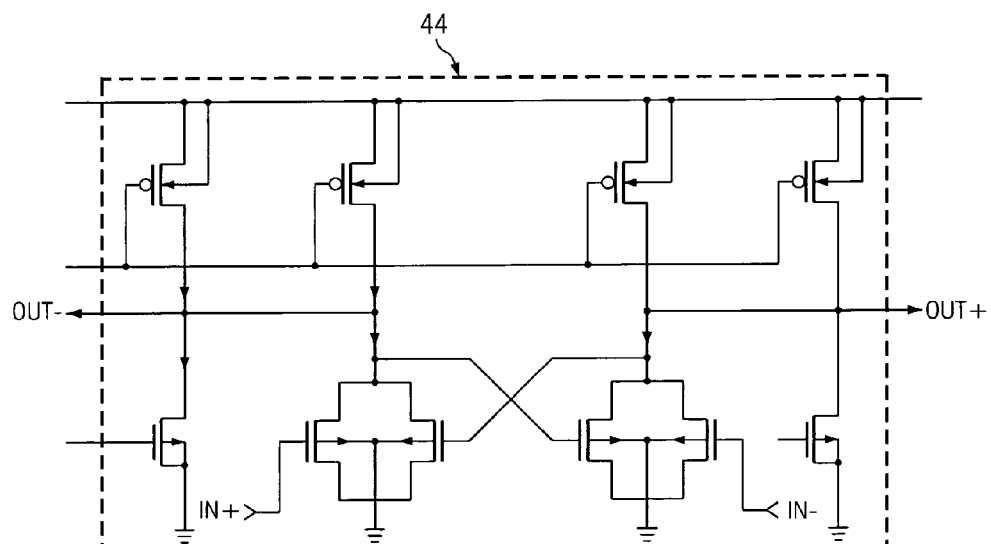
FIG. 3 illustrates an example current-controlled oscillator (CCO) element.

In Equation 4, $K_{ICO}$ represents gain of CCO 18 in Hz/A, s represents a frequency of operation, M represents a PLL multiplier setting, and $g_m$ represents transconductance of $Mg_m$. Clock dithering may be desirable in certain applications and undesirable in other applications, according to particular needs. In particular embodiments, to provide clock dithering, a suitable current addition and subtraction circuit may be added to current summer 16. The current addition and subtraction circuit may add or subtract current from the input to CCO 18 at a periodic rate to reduce power output of PLL 10. In particular embodiments, to provide clock dithering, a high-resistance transistor may be added to each CCO element 44. FIG. 3 illustrates an example CCO element 44. In particular embodiments, to provide clock dithering, a high-resistance transistor may be added to CCO element 44, with the gate and the drain of the transistor coupled to OUT- and the source of the transistor coupled to $V_{DD}$. The source current of the transistor may be approximately equal to $I_{INT}$ divided by one hundred.

Figure 4:
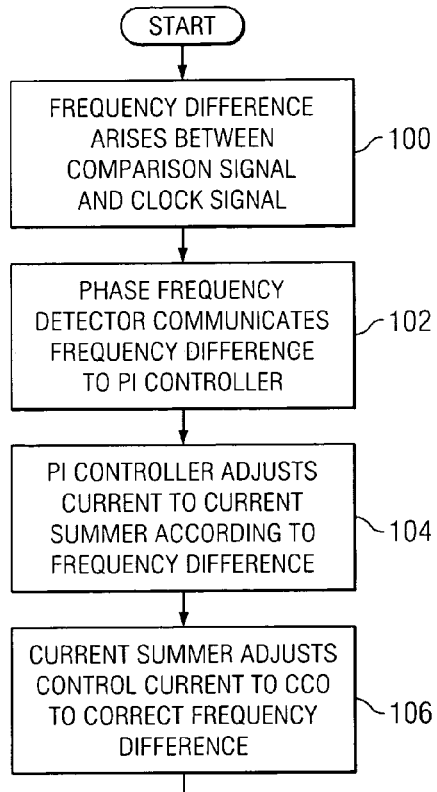
FIG. 4 illustrates an example method for frequency correction in a PLL.

FIG. 4 illustrates an example method for frequency correction in PLL 10. The method begins at step 100, where a frequency difference arises between comparison signal 28 and clock signal 24. At step 102, phase frequency detector 12 communicates the frequency difference to PI controller 14. At step 104, PI controller 14 adjusts current 32a to current summer 16 according to the frequency difference. At step 106, in response to the change in current 32a, current summer 16 adjusts control current 34 to CCO 18 to correct the frequency difference, at which point the method ends.

Figure 5:
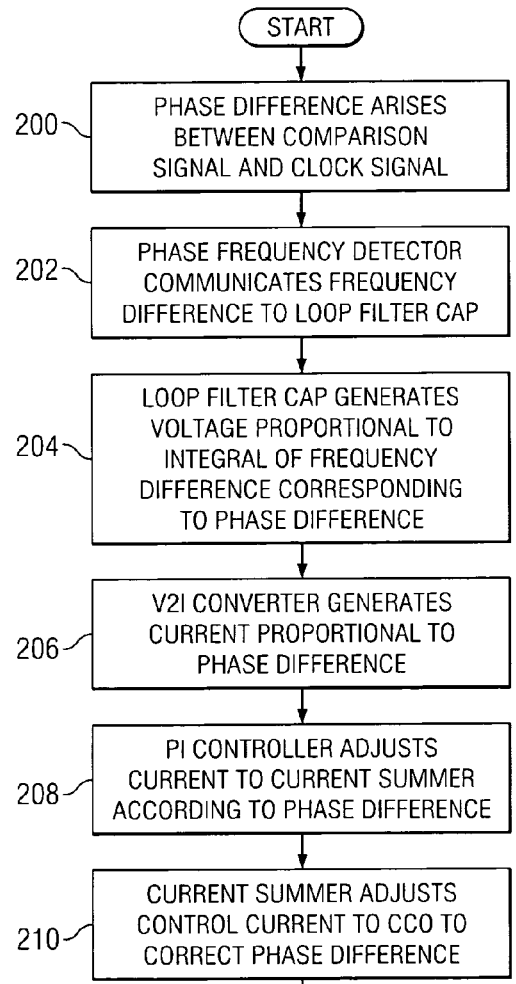
FIG. 5 illustrates an example method for phase correction in a PLL.

FIG. 5 illustrates an example method for phase correction in PLL 10. The method begins at step 200, where a phase difference arises between comparison signal 28 and clock signal 24. At step 202, phase frequency detector 12 communicates a frequency difference to a loop filter cap. At step 204, the loop filter cap generates a voltage that is proportional to an integral of the frequency difference. The integral of the frequency difference corresponds to the phase difference. At step 206, V2I converter 42 generates a current that is proportional to the phase difference. At step 208, PI controller 14 adjusts current 32b to current summer 16 according to the phase difference. At step 210, in response to the change in current 32b, current summer 16 adjusts control current 34 to CCO 18 to correct the phase difference, at which point the method ends.

Although the methods illustrated in FIGS. 4 and 5 have been illustrated and described separately, these methods may be executed more or less simultaneously in PLL 10, using one or more of the same components, according to particular needs. Although the present invention has been described with several embodiments, myriad changes, variations, alterations, transformations, and modifications may be suggested to one skilled in the art, and it is intended that the present invention encompass such changes, variations, alterations, transformations, and modifications as fall within the scope of the appended claims. The present invention is not intended to be limited, in any way, by any statement in the specification that is not reflected in the claims.

What is claimed is:

1. A system for frequency and phase correction in a phase-locked loop (PLL), the system comprising:
   a phase frequency detector operable to:
      detect a frequency difference and a phase difference between a clock signal and a comparison signal, the comparison signal being derived from an output signal of the PLL;
      communicate the frequency difference to a first charge pump generating a first current; and
      communicate the phase difference to a second charge pump generating a voltage;
   the first charge pump operable to:
      modify the first current according to the frequency difference; and
      communicate the first current to a current summer;
   the second charge pump operable to:
      modify the voltage according to the phase difference; and
      communicate the voltage to a voltage-to-current (V2I) converter;
   the V2I converter operable to:
      generate a second current corresponding to the voltage; and
      communicate the second current to the current summer;
   the current summer operable to:
      combine the first and second currents with each other to generate a control current for a current-controlled oscillator (CCO); and
      communicate the control current to the CCO; and
   the CCO operable to generate one or more oscillating signals according to the first and second currents, a frequency of an oscillating signal from the CCO changing in response to the modification of the first current, a phase of the oscillating signal changing in response to the modification of the second current.

2. The system of claim 1, wherein the CCO comprises one or more transistor devices for clock dithering.

3. The system of claim 1, wherein the current summer comprises a current addition and subtraction circuit for clock dithering.

4. The system of claim 1, wherein each of the oscillating signals has a frequency and a phase, the frequencies of the oscillating signals being at least approximately equal to each other, the phases of the oscillating signals being approximately equal to each other.

5. The system of claim 1, wherein:
   the oscillating signals from the CCO are sinusoidal; and
   the system further comprises one or more converters that are each operable to covert one or more oscillating signals from the CCO into substantially square waves.

6. The system of claim 1, wherein the CCO comprises one or more CCO elements that are each operable to generate two oscillating signals that are approximately 180° apart from each other in phase.

7. A method for frequency and phase correction in a phase-locked loop (PLL), the method comprising:
   using a phase frequency detector to:
      detect a frequency difference and a phase difference between a clock signal and a comparison signal, the comparison signal being derived from an output signal of the PLL;
      communicate the frequency difference to a first charge pump generating a first current; and
      communicate the phase difference to a second charge pump generating a voltage;
   using the first charge pump to:
      modify the first current according to the frequency difference; and
      communicate the first current to a current summer;
   using the second charge pump operable to:
      modify the voltage according to the phase difference; and
      communicate the voltage to a voltage-to-current (V2I) converter;
   using the V2I converter to:
      generate a second current corresponding to the voltage; and
      communicate the second current to the current summer;
   using the current summer to:
      combine the first and second currents with each other to generate a control current for a current-controlled oscillator (CCO); and
      communicate the control current to the CCO; and
   using the CCO to generate one or more oscillating signals according to the first and second currents, a frequency of an oscillating signal from the CCO changing in response to the modification of the first current, a phase of the oscillating signal changing in response to the modification of the second current.

8. The method of claim 7, wherein the CCO comprises one or more transistor devices for clock dithering.

9. The method of claim 7, wherein the current summer comprises a current addition and subtraction circuit for clock dithering.

10. The method of claim 7, wherein each of the oscillating signals has a frequency and a phase, the frequencies of the oscillating signals being at least approximately equal to each other, the phases of the oscillating signals being approximately equal to each other.

11. The method of claim 7, wherein:
the oscillating signals from the CCO are sinusoidal; and
the system further comprises one or more converters that are each operable to covert one or more oscillating signals from the CCO into substantially square waves.

12. The method of claim 7, wherein the CCO comprises one or more CCO elements that are each operable to generate two oscillating signals that are approximately 180° apart from each other in phase.

13. Logic for frequency and phase correction in a phase-locked loop (PLL), the logic encoded in media and when executed providing:
a phase frequency detector operable to:
detect a frequency difference and a phase difference between a clock signal and a comparison signal, the comparison signal being derived from an output signal of the PLL;
communicate the frequency difference to a first charge pump generating a first current; and
communicate the phase difference to a second charge pump generating a voltage;
the first charge pump operable to:
modify the first current according to the frequency difference; and
communicate the first current to a current summer;
the second charge pump operable to:
modify the voltage according to the phase difference; and
communicate the voltage to a voltage-to-current (V2I) converter;
the V2I converter operable to:
generate a second current corresponding to the voltage; and
communicate the second current to the current summer;
the current summer operable to:
combine the first and second currents with each other to generate a control current for a current-controlled oscillator (CCO); and
communicate the control current to the CCO; and
the CCO operable to generate one or more oscillating signals according to the first and second currents, a frequency of an oscillating signal from the CCO changing in response to the modification of the first current, a phase of the oscillating signal changing in response to the modification of the second current.

14. The logic of claim 13, wherein the CCO comprises one or more transistor devices for clock dithering.

15. The logic of claim 13, wherein the current summer comprises a current addition and subtraction circuit for clock dithering.

16. The logic of claim 13, wherein each of the oscillating signals has a frequency and a phase, the frequencies of the oscillating signals being at least approximately equal to each other, the phases of the oscillating signals being approximately equal to each other.

17. The logic of claim 13, wherein:
the oscillating signals from the CCO are sinusoidal; and
the system further comprises one or more converters that are each operable to covert one or more oscillating signals from the CCO into substantially square waves.

18. The logic of claim 13, wherein the CCO comprises one or more CCO elements that are each operable to generate two oscillating signals that are approximately 180° apart from each other in phase.

* * * * *